US009475152B2

(12) United States Patent
Morishige et al.

(10) Patent No.: US 9,475,152 B2
(45) Date of Patent: Oct. 25, 2016

(54) LASER PROCESSING METHOD AND LASER PROCESSING APPARATUS

(71) Applicant: DISCO CORPORATION, Tokyo (JP)

(72) Inventors: Yukio Morishige, Tokyo (JP); Kuniaki Iwashiro, Tokyo (JP)

(73) Assignee: Disco Corporation, Tokyo (JP)

( * ) Notice: Subject to any disclaimer, the term of this patent is extended or adjusted under 35 U.S.C. 154(b) by 98 days.

(21) Appl. No.: 14/525,798

(22) Filed: Oct. 28, 2014

(65) Prior Publication Data

US 2015/0121961 A1    May 7, 2015

(30) Foreign Application Priority Data

Nov. 1, 2013    (JP) .................................. 2013-228363

(51) Int. Cl.
*B23K 26/53* (2014.01)
*B23K 26/40* (2014.01)
*B23K 26/06* (2014.01)
*B23K 26/08* (2014.01)
*B23K 26/00* (2014.01)
*H01L 21/78* (2006.01)

(52) U.S. Cl.
CPC ....... *B23K 26/4075* (2013.01); *B23K 26/0006* (2013.01); *B23K 26/0057* (2013.01); *B23K 26/0643* (2013.01); *B23K 26/083* (2013.01); *B23K 26/0853* (2013.01); *B23K 26/53* (2015.10); *B23K 2203/56* (2015.10); *H01L 21/78* (2013.01)

(58) Field of Classification Search
CPC .......... B23K 26/0006; B23K 26/0057; B23K 26/0643; B23K 26/083; B23K 26/0853; B23K 26/40; B23K 26/402; B23K 26/53; H01L 21/78
See application file for complete search history.

(56) References Cited

U.S. PATENT DOCUMENTS

| 6,770,843 | B2* | 8/2004 | Nakai | B23K 26/0643 |
| | | | | 219/121.73 |
| 6,876,689 | B2* | 4/2005 | Walling | H01S 3/10092 |
| | | | | 372/18 |
| 7,497,213 | B2* | 3/2009 | Nagai | B23K 26/0853 |
| | | | | 125/23.01 |
| 2004/0002199 | A1* | 1/2004 | Fukuyo | B23K 26/0057 |
| | | | | 438/460 |
| 2004/0012844 | A1* | 1/2004 | Ohtsuki | B23K 26/0643 |
| | | | | 359/341.1 |

(Continued)

FOREIGN PATENT DOCUMENTS

EP    1722450 A1 * 11/2006
JP    2002-192370    7/2002

(Continued)

OTHER PUBLICATIONS

Hemmer et al., "High Repetition Rate, Narrow Linewidth and Spatially Controlled Operation of a Q-switched Nd:YVO4 Laser", Dec. 2010, Proceedings of SPIE, vol. 7686, 768605-1 to 768605-5.*

(Continued)

*Primary Examiner* — Geoffrey S Evans
(74) *Attorney, Agent, or Firm* — Greer Burns & Crain, Ltd.

(57) ABSTRACT

The present invention provides a laser processing method in which a modified layer is formed inside a workpiece by irradiating the workpiece with a laser beam having such a wavelength as to be transmitted through the workpiece with the focal point of the laser beam positioned inside the workpiece. In the laser processing method, the spectral line width of the laser beam is set equal to or smaller than 10 pm.

6 Claims, 8 Drawing Sheets

(56) References Cited

U.S. PATENT DOCUMENTS

| | | | |
|---|---|---|---|
| 2004/0089644 A1* | 5/2004 | Sekiya | H01L 21/78 219/121.72 |
| 2006/0043079 A1* | 3/2006 | Dane | C21D 10/005 219/121.85 |
| 2007/0202619 A1* | 8/2007 | Tamura | B23K 26/0057 438/22 |
| 2009/0277889 A1* | 11/2009 | Kobayashi | B23K 26/0057 219/121.67 |
| 2012/0002688 A1* | 1/2012 | Munroe | H01S 3/067 372/26 |
| 2012/0088354 A1* | 4/2012 | Furuta | H01L 21/78 438/463 |
| 2012/0100696 A1* | 4/2012 | Nakamura | H01L 21/78 438/463 |
| 2013/0189806 A1* | 7/2013 | Hoshino | H01L 33/0095 438/29 |
| 2013/0235895 A1* | 9/2013 | Mizuuchi | G02F 1/37 372/92 |
| 2013/0244449 A1* | 9/2013 | Baird | B23K 26/0732 438/795 |

FOREIGN PATENT DOCUMENTS

| | | |
|---|---|---|
| JP | 2010-158686 A1 * | 7/2010 |
| WO | WO-2014/061438 A1 * | 4/2014 |

OTHER PUBLICATIONS

Liu et al., "High-Power narrow-linewidth quasi-CW diode-pumped TEM00 1064 nm Nd:YAG ring laser", Apr. 2012, Optical Society of America, vol. 51, No. 10, pp. C27-C31.*

* cited by examiner

LASER PROCESSING METHOD AND LASER PROCESSING APPARATUS

BACKGROUND OF THE INVENTION

1. Field of the Invention

The present invention relates to a laser processing method and a laser processing apparatus to perform laser processing for a workpiece such as a semiconductor wafer.

2. Description of the Related Art

In a semiconductor device manufacturing process, plural areas are partitioned by division lines arranged in a lattice manner on a surface of a semiconductor wafer having a substantially circular disc shape and devices such as ICs and LSIs are formed in these partitioned areas. Then, the semiconductor wafer is cut along the division lines to separate the areas in which the devices are formed, so that the individual devices are manufactured. As a method for dividing the above-described semiconductor wafer along the division lines, a laser processing method is attempted in which a pulse laser beam having such a wavelength as to be transmitted through the wafer is used and the wafer is irradiated with the pulse laser beam with the focal point positioned inside the area along which the dividing should be performed.

The dividing method using this laser processing method is the following technique. Specifically, a modified layer is continuously formed inside the wafer along the division lines by irradiating the wafer with the pulse laser beam having such a wavelength as to be transmitted through the wafer along the division lines with the focal point of the pulse laser beam positioned at the inside corresponding to the division line from one surface side of the wafer. Then, the wafer is divided into the individual devices by applying an external force along the division lines whose strength is lowered due to the forming of this modified layer (refer to e.g. Japanese Patent No. 3408805). The above-described laser processing technique is to continuously form the modified layer inside the wafer along the division lines by irradiating the wafer with e.g. a pulse laser beam with a wavelength of 1320 nm having transmissibility to a silicon wafer along the division lines with the focal point of the pulse laser beam positioned at the inside corresponding to the division line, and has an advantage that the width of the division line can be made small.

SUMMARY OF THE INVENTION

However, because the wafer is irradiated with the laser beam from the back surface side, on which the devices are not formed, there is a problem that the laser beam that does not contribute to the forming of the modified layer becomes passing light to damage the devices formed on the front surface. Furthermore, if the modified layer is formed by using a laser beam with a wavelength of 1064 nm, which is close to the optical absorption edge although having transmissibility to a silicon wafer, to suppress the passing light, the width of the modified layer in the thickness direction of the wafer is about 30 μm. Thus, there is a problem that several modified layers need to be formed in a stacked manner in a wafer having a thickness over 100 μm and therefore the productivity is low.

Therefore, an object of the present invention is to provide a laser processing method and a laser processing apparatus that can suppress the passing light and increase the width of the modified layer in the thickness direction of a workpiece.

In accordance with an aspect of the present invention, there is provided a laser processing method in which a modified layer is formed inside a workpiece by irradiating the workpiece with a laser beam having such a wavelength as to be transmitted through the workpiece with a focal point of the laser beam positioned inside the workpiece. The laser processing method includes a step of setting the spectral line width of the laser beam equal to or smaller than 10 pm.

Preferably, the workpiece is a silicon substrate and the wavelength of the laser beam is set to 1064 nm.

In accordance with another aspect of the present invention, there is provided a laser processing apparatus including a chuck table that holds a workpiece, a laser beam irradiator that performs laser processing for the workpiece held by the chuck table, and a processing feed means that moves the chuck table relative to the laser beam irradiator in a processing feed direction. The laser beam irradiator includes a laser beam oscillator that oscillates a laser beam and a focusing means that focuses the laser beam oscillated from the laser beam oscillator and irradiates the workpiece held by the chuck table with the laser beam, and the spectral line width of the laser beam to be oscillated is set equal to or smaller than 10 pm in the laser beam oscillator.

Preferably, the laser beam oscillator includes a pumping light source, a laser medium, and an optical resonator, and the optical resonator includes a cyclic optical system that cycles light emitted by the pumping light source in one direction. Furthermore, the laser medium and an etalon are disposed in the cyclic optical system and the spectral line width of the laser beam is set equal to or smaller than 10 pm by the etalon.

Preferably, the cyclic optical system is composed of a first half mirror disposed on the side of the pumping light source, a Q-switch that is so disposed as to sandwich the laser medium with the first half mirror, a linear polarizing element that converts light that has passed through the Q-switch to linearly-polarized light, the etalon that reduces the spectral line width of the light converted to the linearly-polarized light by the linear polarizing element, a Faraday rotator that rotates, by 45 degrees, the polarization plane of the light whose spectral line width is reduced by the etalon and blocks light from an opposite direction, a half-wave plate that returns the polarization plate rotated by the Faraday rotator to an original state, a second half mirror that reflects light that has passed through the half-wave plate to guide the light to a cyclic path, and a pair mirror that is disposed on the cyclic path and returns the light reflected by the second half mirror to the first half mirror.

Preferably, a laser medium of the laser beam oscillator is YAG and the wavelength of the laser beam is set to 1064 nm.

In the present invention, the spectral line width of the laser beam oscillated by the laser beam oscillator is set equal to or smaller than 10 pm and laser processing is performed by the laser beam whose wavelength purity is high. Therefore, a modified layer that is wide in the thickness direction can be formed inside the workpiece and thus the productivity is enhanced. In addition, most of the laser beam is consumed for the forming of the modified layer. Thus, passing light is suppressed and devices formed on the front surface of a silicon substrate forming a wafer as the workpiece are not damaged.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
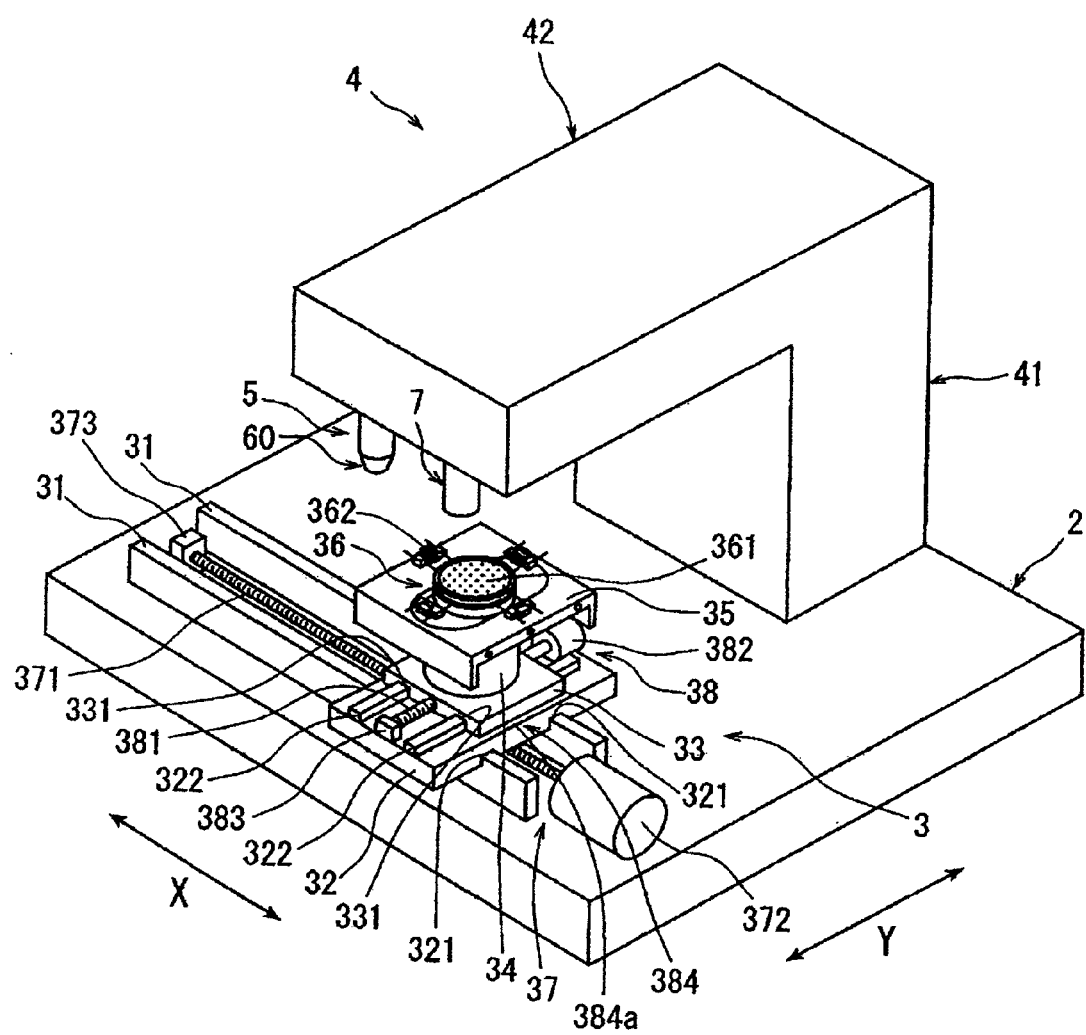
FIG. 1 is a perspective view of a laser processing apparatus configured in accordance with the present invention.

A preferred embodiment of a laser processing method and a laser processing apparatus according to the present invention will be described in detail below with reference to the accompanying drawings. In FIG. 1, a perspective view of a laser processing apparatus configured in accordance with the present invention is shown. The laser processing apparatus shown in FIG. 1 includes a stationary pedestal 2, a chuck table mechanism 3 that is disposed on the stationary pedestal 2 movably in a processing feed direction (X-axis direction) indicated by arrows X and holds a workpiece, and a laser beam irradiation unit 4 as a laser beam irradiator disposed on the pedestal 2.

The chuck table mechanism 3 includes a pair of guide rails 31 disposed on the stationary pedestal 2 in parallel along the X-axis direction, a first sliding block 32 disposed on these guide rails 31 movably in the X-axis direction, and a second sliding block 33 disposed on the first sliding block 32 movably in an indexing feed direction (Y-axis direction) that is orthogonal to the processing feed direction (X-axis direction) and is indicated by arrows Y. The chuck table mechanism 3 further includes a support table 35 supported by a cylindrical member 34 over the second sliding block 33 and a chuck table 36 as workpiece holder. This chuck table 36 has a suction chuck 361 formed from a porous material and e.g. a semiconductor wafer having a circular disc shape as a workpiece is held on a holding surface, which is the upper surface of the suction chuck 361, by a suction unit (not shown). The chuck table 36 formed in this manner is rotated by a pulse motor (not shown) disposed in the cylindrical member 34. On the chuck table 36, clamps 362 for fixing a ring-shaped frame that supports a workpiece such as a semiconductor wafer with the intermediary of a protective tape are disposed.

For the first sliding block 32, a pair of guided grooves 321 fitted to the pair of guide rails 31 are made in its lower surface and a pair of guide rails 322 formed in parallel along the Y-axis direction are provided on its upper surface. The first sliding block 32 formed in this manner is so configured as to be movable in the X-axis direction along the pair of guide rails 31 through the fitting of the guided grooves 321 to the pair of guide rails 31. The chuck table mechanism 3 in the present embodiment includes a processing feed unit 37 for moving the first sliding block 32 in the X-axis direction along the pair of guide rails 31. The processing feed unit 37 includes a male screw rod 371 disposed between the pair of guide rails 31 in parallel and a drive source such as a pulse motor 372 for rotationally driving the male screw rod 371. One end of the male screw rod 371 is rotatably supported by a bearing block 373 fixed to the stationary pedestal 2 and the other end is transmissibly connected to the output shaft of the pulse motor 372. The male screw rod 371 is screwed to a through female screw hole formed in a female screw block (not shown) provided in a protruding manner on the lower surface of the center part of the first sliding block 32. Therefore, by driving the male screw rod 371 by the pulse motor 372 to cause the forward rotation and reversion rotation of it, the first sliding block 32 is moved in the X-axis direction along the guide rails 31.

In the lower surface of the second sliding block 33, a pair of guided grooves 331 fitted to the pair of guide rails 322 provided on the upper surface of the first sliding block 32 are made. The second sliding block 33 is configured movably in the Y-axis direction through the fitting of these guided grooves 331 to the pair of guide rails 322. The chuck table mechanism 3 in the embodiment shown in FIG. 1 includes an indexing feed unit 38 for moving the second sliding block 33 in the Y-axis direction along the pair of guide rails 322 provided on the first sliding block 32. The indexing feed unit 38 includes a male screw rod 381 disposed between the pair of guide rails 322 in parallel and a drive source such as a pulse motor 382 for rotationally driving the male screw rod 381. One end of the male screw rod 381 is rotatably supported by a bearing block 383 fixed to the upper surface of the first sliding block 32 and the other end is transmissibly connected to the output shaft of the pulse motor 382. The male screw rod 381 is screwed to a through female screw hole formed in a female screw block (not shown) provided in a protruding manner on the lower surface of the center part of the second sliding block 33. Therefore, by driving the male screw rod 381 by the pulse motor 382 to cause the forward rotation and reversion rotation of it, the second sliding block 33 is moved in the Y-axis direction along the guide rails 322.

The laser beam irradiation unit 4 includes a support member 41 disposed on the pedestal 2, a casing 42 that is supported by the support member 41 and extends substantially horizontally, a laser beam irradiator 5 disposed on the casing 42, and an imager 7 that is disposed at the front end part of the casing 42 and detects a processing area on which laser processing should be performed. In the present embodiment, the imager 7 is formed of, besides a normal imaging element (CCD) that performs imaging by a visible beam, an infrared illuminator that irradiates a workpiece with infrared, an optical system that captures the infrared irradiated by the infrared illuminator, an imaging element (infrared CCD) that outputs an electric signal corresponding to the infrared captured by the optical system, and so forth. The imager 7 sends an image signal obtained by imaging to a control unit to be described later.

The laser beam irradiator 5 will be described with reference to FIG. 2. The laser beam irradiator 5 includes a pulse laser beam oscillator 6 and a focusing unit 60 that focuses a pulse laser beam oscillated from the pulse laser beam oscillator 6 and irradiates a workpiece W held by the chuck table 36 with the pulse laser beam. The pulse laser beam oscillator 6 includes a pumping light source 61 and an optical resonator 63. Light oscillated from the pumping light source 61 is focused by a focusing lens 62 to be made incident on the optical resonator 63.

The optical resonator 63 includes a cyclic optical system 64 that cycles, in one direction, the light that is oscillated from the pumping light source 61 and is focused by the focusing lens 62. This cyclic optical system 64 is composed of the following components: a first half mirror 641 disposed on the side of the focusing lens 62, which focuses the light oscillated from the pumping light source 61; a laser medium 642 disposed on the optical path of the light guided via the first half mirror 641; a Q-switch 643 that is so disposed as to sandwich the laser medium 642 with the first half mirror 641; a linear polarizing element 644 that converts light that has passed through the Q-switch 643 to linearly-polarized light; an etalon 645 that reduces the spectral line width of the light converted to the linearly-polarized light by the linear polarizing element 644; a Faraday rotator 646 that rotates, by 45 degrees, the polarization plane of the light whose spectral line width is reduced by the etalon 645 and blocks light from the opposite direction; a half-wave plate 647 that returns the polarization plate rotated by the Faraday rotator 646 to the original state; a second half mirror 648 that reflects light that has passed through the half-wave plate 647 to guide the light to a cyclic path 640; and a pair mirror 649 that is disposed on the cyclic path 640 and is composed of a first mirror 649a and a second mirror 649b for returning the light reflected by the second half mirror 648 to the first half mirror 641. The laser medium 642 is YAG and the wavelength of the light is set to 1064 nm.

The optical resonator 63 forming the pulse laser beam oscillator 6 in the present embodiment is formed in the above-described manner. The optical resonator 63 cycles the light that is oscillated from the pumping light source 61 and is focused by the focusing lens 62 and reduces the spectral line width every time the light passes through the etalon 645. The light that cycles with its spectral line width reduced every time the light passes through the etalon 645 in this manner passes through the second half mirror 648 to be oscillated as the pulse laser beam through actuation of the Q-switch 643 controlled by the control unit to be described later corresponding to the repetition frequency. The pulse laser beam oscillated from the pulse laser beam oscillator 6 in this manner is adjusted to predetermined output power by an output power adjuster 66 controlled by the control unit to be described later and the resulting pulse laser beam is made incident on the focusing unit 60.

The focusing unit 60 is composed of a direction converting mirror 601 that converts the direction of the pulse laser beam oscillated from the pulse laser beam oscillator 6 to the downward direction and an objective focusing lens 602 that focuses the laser beam whose direction is converted by the direction converting mirror 601. The focusing unit 60 formed in this manner focuses the pulse laser beam whose spectral line width has become equal to or smaller than 10 pm due to the optical resonator 63 forming the pulse laser beam oscillator 6 and irradiates the workpiece W held by the chuck table 36 with the pulse laser beam.

Figure 3:
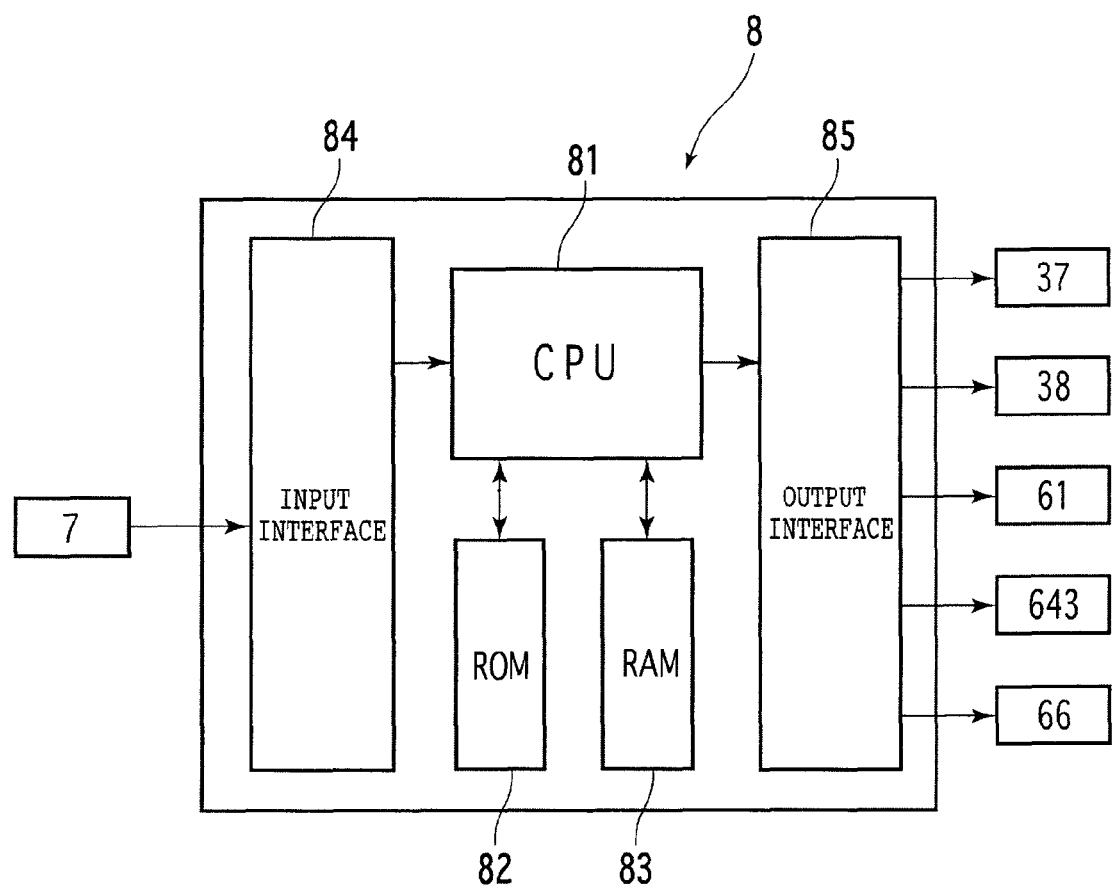
FIG. 3 is a block configuration diagram of a control unit mounted in the laser processing apparatus shown in FIG. 1.

The laser processing apparatus in the present embodiment includes a control unit 8 shown in FIG. 3. The control unit 8 is formed of a computer. It includes a central processing unit (CPU) 81 that executes arithmetic processing in accordance with a control program, a read only memory (ROM) 82 to store the control program and so forth, a readable/writable random access memory (RAM) 83 to store an arithmetic result and so forth, an input interface 84, and an output interface 85. To the input interface 84 of the control unit 8, a detection signal from the imager 7 and so forth is input. From the output interface 85 of the control unit 8, control signals are output to the processing feed unit 37, the indexing feed unit 38, the pumping light source 61 and the Q-switch 643 in the laser beam irradiator 5, the output power adjuster 66, and so forth.

Figure 4A:
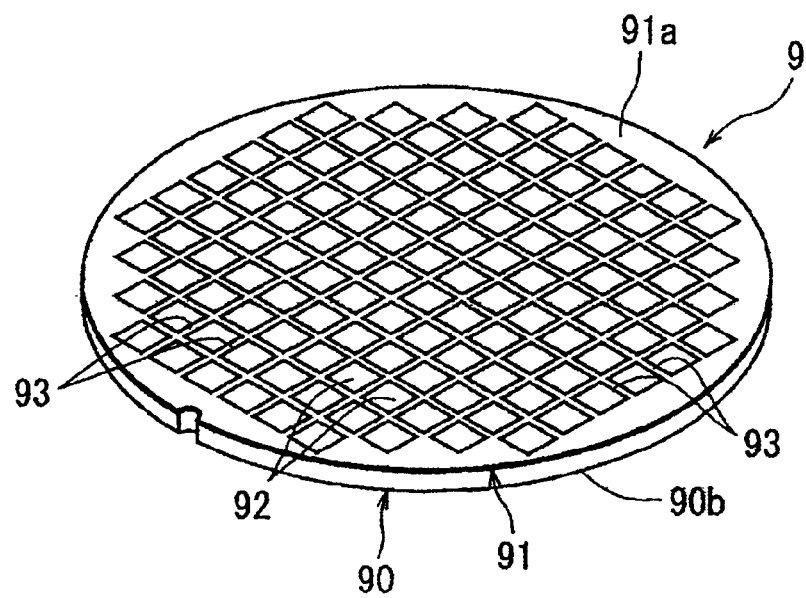
FIG. 4A is a perspective view of a semiconductor wafer as a workpiece.
Figure 4B:
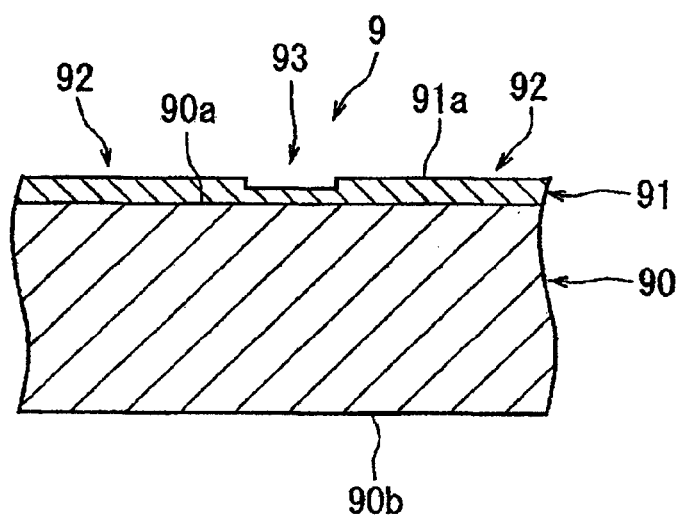
FIG. 4B is an enlarged sectional view of the major part of the semiconductor wafer.

The laser processing apparatus in the present embodiment is formed in the above-described manner. The operation thereof will be described below. In FIGS. 4A and 4B, a perspective view of a semiconductor wafer as a workpiece and an enlarged sectional view of the major part thereof are shown. In a semiconductor wafer 9 shown in FIGS. 4A and 4B, over a front surface 90a of a silicon substrate 90 having a thickness of 150 μm, devices 92 such as plural ICs and LSIs are formed in a matrix manner by a functional layer 91 obtained by stacking an insulating film and a functional film to form circuits. Furthermore, the respective devices 92 are partitioned by division lines 93 (in the present embodiment, the width is set to 50 μm) formed in a lattice manner. In the present embodiment, the insulating film forming the functional layer 91 is formed of an $SiO_2$ film or a low dielectric constant insulator coat (Low-k film) formed of an inorganic substance-based film of SiOF, BSG (SiOB), or the like or an organic substance-based film that is a polymer film of a polyimide-based or parylene-based substance or the like, and the thickness thereof is set to 10 μm.

Figure 5:
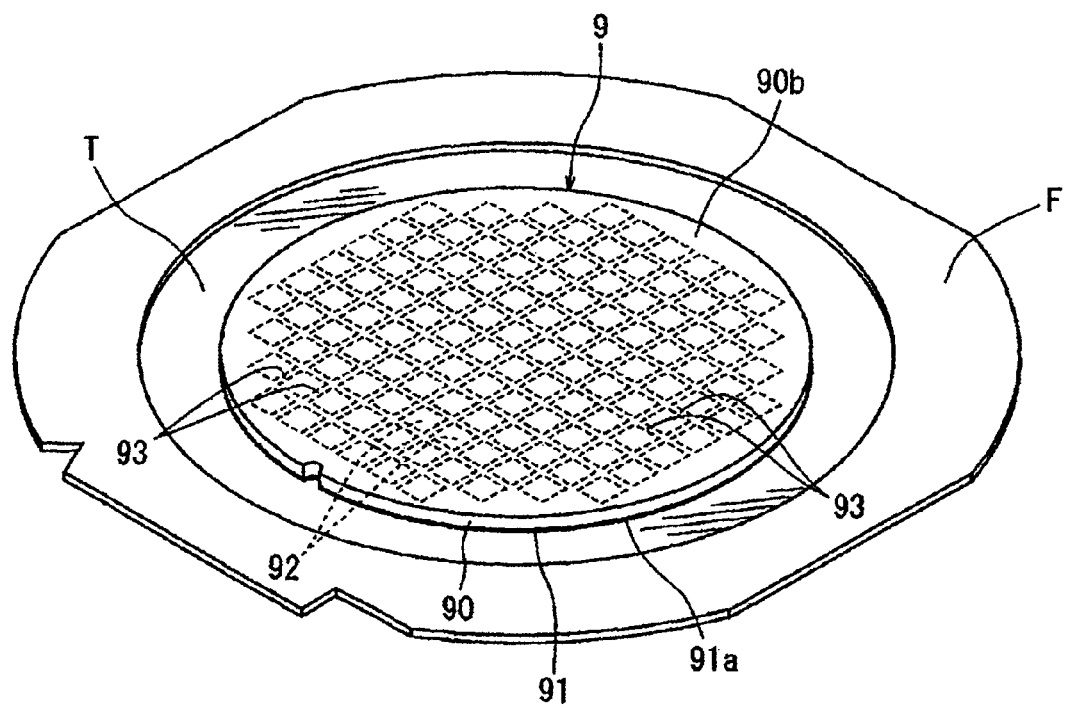
FIG. 5 is a perspective view showing a state in which the semiconductor wafer shown in FIG. 4A is attached to the front surface of a dicing tape mounted on a ring-shaped frame.

A description will be made about a modified layer forming step in which a modified layer is formed along the division lines 93 inside the silicon substrate 90 forming the above-described semiconductor wafer 9. First, a wafer supporting step is carried out in which a dicing tape is attached to a front surface 91a of the functional layer 91 forming the semiconductor wafer 9 and the outer circumferential part of the dicing tape is supported by a ring-shaped frame. Specifically, as shown in FIG. 5, the front surface 91a of the functional layer 91 forming the semiconductor wafer 9 is attached to a surface of a dicing tape T whose outer circumferential part is so mounted that the inside opening of a ring-shaped frame F is covered. Therefore, in the semiconductor wafer 9 attached to the surface of the dicing tape T, a back surface 90b of the silicon substrate 90 is oriented upward.

After the above-described wafer supporting step is carried out, the side of the dicing tape T for the semiconductor wafer 9 is placed on the chuck table 36 of the laser processing apparatus shown in FIG. 1. Then, the semiconductor wafer 9 is sucked and held over the chuck table 36 with the intermediary of the dicing tape T by actuating a suction unit (not shown) (wafer holding step). Therefore, in the semiconductor wafer 9 held over the chuck table 36 with the intermediary of the dicing tape T, the back surface 90b of the silicon substrate 90 is oriented upward.

The chuck table 36 that holds the semiconductor wafer 9 by suction as described above is positioned directly beneath the imager 7 by the processing feed unit 37. After the chuck table 36 is positioned directly beneath the imager 7 in this manner, alignment work of detecting a processing area on which laser processing should be performed on the semiconductor wafer 9 is performed by the imager 7 and the control unit 8. Specifically, the imager 7 and the control unit 8 execute image processing such as pattern matching for performing position adjustment between the division lines 93 formed along a first direction of the semiconductor wafer 9 and the focusing unit 60 forming the laser beam irradiator 5, which irradiates a laser beam along the division lines 93, to implement alignment of the laser beam irradiation position. Furthermore, alignment of the laser beam irradiation position is similarly implemented also for the division lines 93 that are formed on the semiconductor wafer 9 and extend along a second direction orthogonal to the first direction. At this time, the front surface 91a of the functional layer 91, on which the division lines 93 of the semiconductor wafer 9 are formed, is located on the lower side. However, because the imager 7 includes an imaging unit formed of the infrared illuminator, the optical system that captures infrared, the imaging element (infrared CCD) that outputs an electric signal corresponding to infrared, and so forth as described above, the division lines 93 can be imaged from the back surface 90b of the silicon substrate 90 in a see-through manner.

Figure 6A:
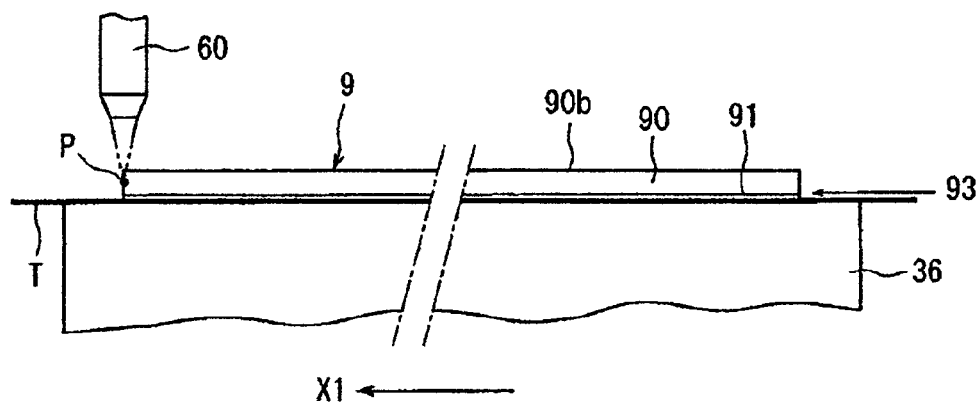
FIGS. 6A and 6B are explanatory diagrams of a modified layer forming step carried out by the laser processing apparatus shown in FIG. 1.
Figure 6B:
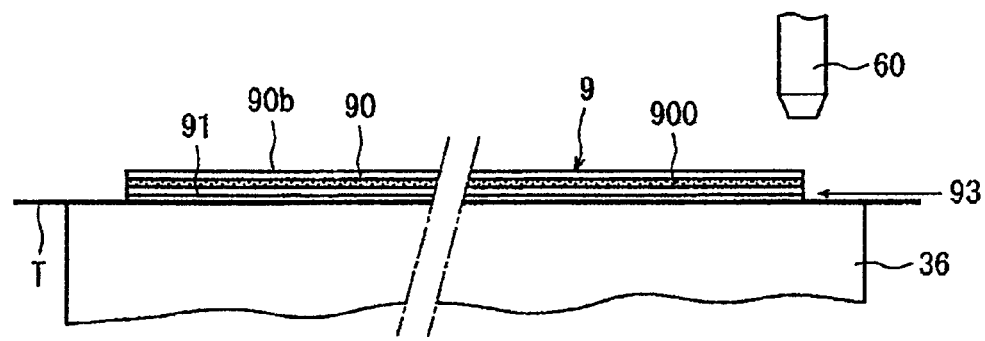

After the division lines 93 formed on the semiconductor wafer 9 held on the chuck table 36 are detected and alignment of the laser beam irradiation position is performed in the above-described manner, the chuck table 36 is moved to the laser beam irradiation area above which the focusing unit 60 of the laser beam irradiator 5, which irradiates the laser beam, is located as shown in FIG. 6A, and one end (left end in FIG. 6A) of the predetermined division line 93 is positioned directly beneath the focusing unit 60 of the laser beam irradiator 5. Then, the chuck table 36 is moved in a direction indicated by an arrow X1 in FIG. 6A at a predetermined feed speed while a pulse laser beam having such a wavelength as to be transmitted through the substrate 90 is irradiated from the focusing unit 60. Then, when the other end (right end in FIG. 6B) of the division line 93 reaches the irradiation position of the focusing unit 60 as shown in FIG. 6B, the irradiation of the pulse laser beam is stopped and the movement of the chuck table 36 is stopped. In this modified layer forming step, a focal point P of the pulse laser beam is positioned at the intermediate part of the silicon substrate 90 forming the semiconductor wafer 9 in the thickness direction corresponding to the division line 93. As a result, a modified layer 900 is formed inside the silicon substrate 90 forming the semiconductor wafer 9 along the division line 93 as shown in FIG. 6B. The above-described modified layer forming step is carried out along all of the division lines 93 formed on the semiconductor wafer 9.

The processing condition in the above-described modified layer forming step is set as follows for example.
wavelength of laser beam: 1064 nm
repetition frequency: 100 kHz
average output power: 1.2 W
pulse width: 400 ns
focused light spot diameter: ($\phi$1 $\mu$m
processing feed speed: 100 mm/second In the processing condition of the above-described modified layer forming step, it is important to set the spectral line width of the laser beam equal to or smaller than 10 pm. Here, experimental results will be described. In the experiments, based on the above-described processing condition, the modified layer forming step was carried out for a silicon substrate having a thickness of 150 $\mu$m by using a laser beam whose spectral line width was set to 10 pm and a laser beam whose spectral line width was set to 100 pm. Then, the width of the modified layer formed in the silicon substrate in the substrate thickness direction and the ratio of passing light were examined.

Experiment 1

Figure 2:
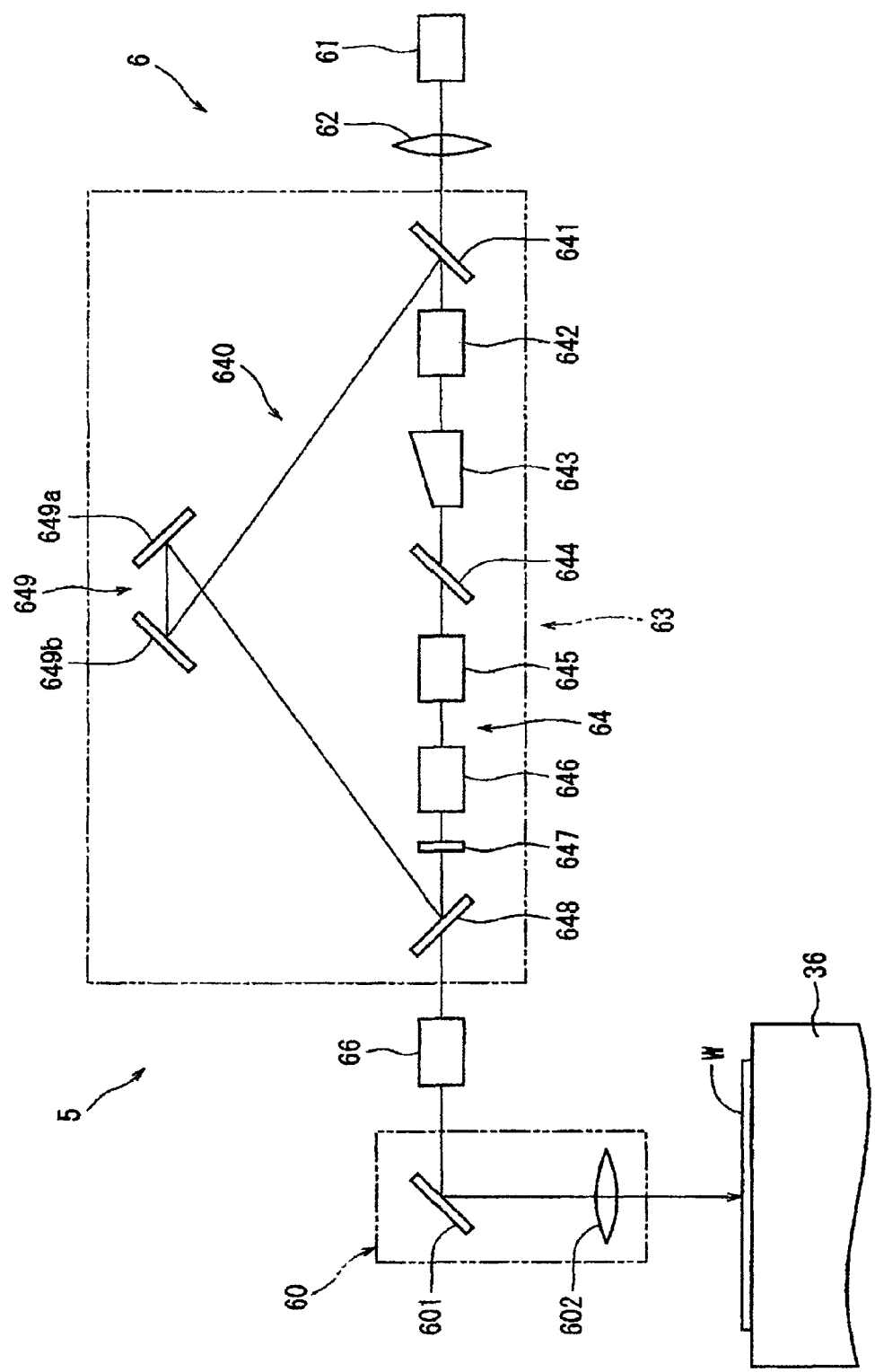
FIG. 2 is a block configuration diagram of a laser beam irradiator mounted in the laser processing apparatus shown in FIG. 1.
Figure 7A:
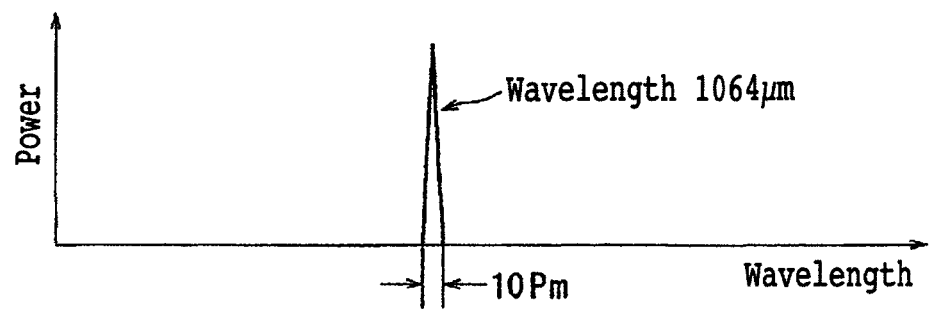
FIGS. 7A and 7B are explanatory diagrams showing a state in which a modified layer is formed in a silicon substrate with the spectral line width of a laser beam set to 10 pm.
Figure 7B:
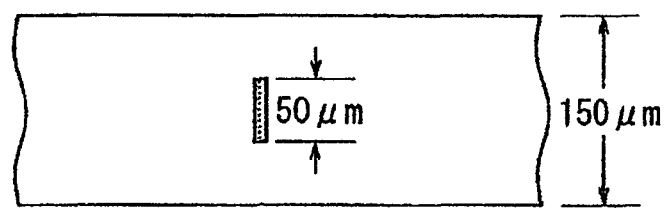

FIG. 7A is a diagram showing the power in a state in which the spectral line width of a laser beam having a wavelength of 1064 nm was set to 10 pm by disposing the etalon 645 in the optical resonator 63 forming the pulse laser beam oscillator 6 of the laser beam irradiator 5 shown in the above-described FIG. 2. By using the laser beam whose spectral line width was set to 10 pm as above, the modified layer forming step was carried out based on the above-described processing condition with the focal point positioned at a depth of 75 $\mu$m from the back surface (upper surface) of the silicon substrate. As a result, the width of the modified layer in the thickness direction was 50 $\mu$m as shown in FIG. 7B and the passing light was 7% of the total output.

Experiment 2

Figure 8A:
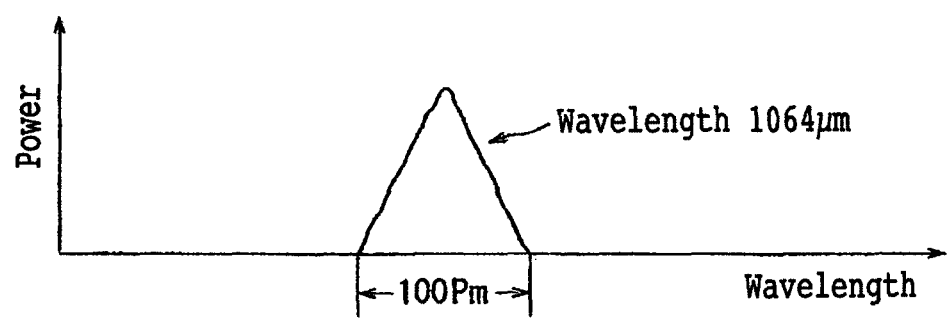
FIGS. 8A and 8B are explanatory diagrams showing a state in which a modified layer is formed in a silicon substrate with the spectral line width of a laser beam set to 100 pm.
Figure 8B:
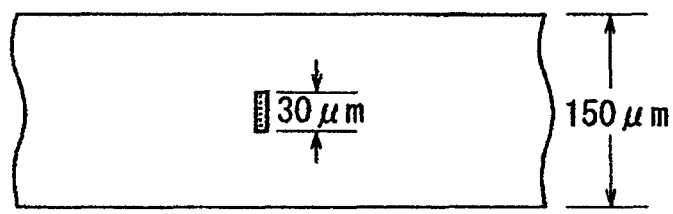

On the other hand, FIG. 8A is a diagram showing the power in a state in which the etalon 645 was removed from the optical resonator 63 forming the pulse laser beam oscillator 6 of the laser beam irradiator 5 shown in the above-described FIG. 2 and the spectral line width of a laser beam having a wavelength of 1064 nm was 100 pm. By using the laser beam whose spectral line width was 100 pm as above, the modified layer forming step was carried out based on the above-described processing condition with the focal point positioned at a depth of 75 $\mu$m from the back surface (upper surface) of the silicon substrate. As a result, the width of the modified layer in the thickness direction was 30 $\mu$m as shown in FIG. 8B and the passing light was 32% of the total output.

In the above-described experiment 1, the example in which the spectral line width of the laser beam was set to 10 pm is described. As additional experiments, experiments similar to experiment 1 were performed with the spectral line width of a laser beam having a wavelength of 1064 nm set to 8 pm and 5 pm. As a result, it was confirmed that the width of the modified layer in the thickness direction was equal to or larger than 50 pm and the passing light was equal to or less than 7% of the total output. Therefore, it was confirmed that the effect was achieved when the spectral line width of the laser beam was set equal to or smaller than 10 pm.

As described above, by using a laser beam whose spectral line width is set equal to or smaller than 10 pm and whose wavelength purity is high, the width of the modified layer in the thickness direction of the silicon substrate increases by at least 60% and the passing light is reduced to up to ¼ compared with the case in which the laser beam whose spectral line width is 100 pm is used. Therefore, the modified layer that is wide in the thickness direction can be formed inside the workpiece and thus the productivity is enhanced. In addition, most of the laser beam is consumed for the forming of the modified layer. Thus, the passing light is suppressed and devices formed on the front surface of the silicon substrate forming the wafer as the workpiece are not damaged.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method comprising:
    providing a workpiece including a plurality of devices that are partitioned by division lines formed in a lattice manner;
    a step of setting spectral line width of a laser beam equal to or smaller than 10 pm; and a step of forming a modified layer inside the workpiece, along one of the division lines, by irradiating the workpiece with the laser beam, which has such a wavelength that is configured to be transmitted through the workpiece, wherein a focal point of the laser beam is positioned inside the workpiece.

2. The laser processing method according to claim 1, wherein:
the workpiece is a silicon substrate and a wavelength of the laser beam is set to 1064 nm.

3. The laser processing method according to claim 1, wherein irradiating the workpiece with the laser comprises:
oscillating the laser beam from a laser beam oscillator;
focusing the laser beam from the laser beam oscillator with a focusing means prior to irradiating the workpiece;
wherein the laser beam oscillator includes a pumping light source, a laser medium, and an optical resonator, and further wherein the optical resonator includes a cyclic optical system that cycles light emitted by the pumping light source in one direction, and still further wherein the cyclic optical system is composed of a first half mirror, a Q-switch, a linear polarizing element that converts light that has passed through the Q-switch into linearly-polarized light, an etalon that reduces spectral line width of the light converted to the linearly-polarized light by the linear polarizing element, a Faraday rotator that rotates, by 45 degrees, a polarization plane of the light whose spectral line width is reduced by the etalon and blocks light from an opposite direction, a half-wave plate that returns the polarization plane rotated by the Faraday rotator to an original state, a second half mirror that reflects light that has passed through the half-wave plate to guide the light to a cyclic path, and a pair mirror that is disposed on the cyclic path and returns the light reflected by the second half mirror to the first half mirror,
wherein the light emitted by the pumping light source:
passes through a first half mirror, the laser medium, the Q switch, the linear polarizing element, the etalon, the Faraday rotator, the half-wave plate and the second half mirror, in order.

4. The laser processing method according to claim 1, wherein:
the modified layer formed by the modified layer forming step has a width, in the thickness direction of the workpiece, of at least 50 μm and
the passing light, which is laser light that is passed to the devices during the modified layer forming step, is less than or equal to less than 7% of the total output.

5. A laser processing apparatus, comprising:
a chuck table that holds a workpiece;
a laser beam irradiator that performs laser processing for the workpiece held by the chuck table; and
a processing feed means that moves the chuck table relative to the laser beam irradiator in a processing feed direction,
wherein:
the laser beam irradiator includes a laser beam oscillator that oscillates a laser beam and a focusing means that focuses the laser beam oscillated from the laser beam oscillator and irradiates the workpiece held by the chuck table with the laser beam, and
spectral line width of the laser beam to be oscillated is set equal to or smaller than 10 pm in the laser beam oscillator,
wherein:
the laser beam oscillator includes a pumping light source, a laser medium, and an optical resonator,
the optical resonator includes a cyclic optical system that cycles light emitted by the pumping light source in one direction, and
the laser medium and an etalon are disposed in the cyclic optical system and the spectral line width of the laser beam is set equal to or smaller than 10 pm by the etalon,
wherein:
the cyclic optical system is composed of a first half mirror disposed on a side of the pumping light source, a Q-switch that is so disposed as to sandwich the laser medium with the first half mirror, a linear polarizing element that converts light that has passed through the Q-switch to linearly-polarized light, the etalon that reduces spectral line width of the light converted to the linearly-polarized light by the linear polarizing element, a Faraday rotator that rotates, by 45 degrees, a polarization plane of the light whose spectral line width is reduced by the etalon and blocks light from an opposite direction, a half-wave plate that returns the polarization plane rotated by the Faraday rotator to an original state, a second half mirror that reflects light that has passed through the half-wave plate to guide the light to a cyclic path, and a pair mirror that is disposed on the cyclic path and returns the light reflected by the second half mirror to the first half mirror.

6. The laser processing apparatus according to claim 5, wherein:
a laser medium of the laser beam oscillator is YAG and a wavelength of the laser beam is set to 1064 nm.

* * * * *